United States Patent
Yang

(10) Patent No.: US 10,621,038 B2
(45) Date of Patent: Apr. 14, 2020

(54) DECODING METHOD, ASSOCIATED FLASH MEMORY CONTROLLER AND ELECTRONIC DEVICE

(71) Applicant: Silicon Motion Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 136 days.

(21) Appl. No.: 16/057,839

(22) Filed: Aug. 8, 2018

(65) Prior Publication Data

US 2019/0050287 A1    Feb. 14, 2019

Related U.S. Application Data

(60) Provisional application No. 62/542,318, filed on Aug. 8, 2017.

(30) Foreign Application Priority Data

Jul. 19, 2018   (TW) .............................. 107124970 A

(51) Int. Cl.
| | |
|---|---|
| *G06F 11/10* | (2006.01) |
| *H03M 13/45* | (2006.01) |
| *G11C 29/52* | (2006.01) |
| *G11C 29/50* | (2006.01) |
| *H03M 13/11* | (2006.01) |

(52) U.S. Cl.
CPC ...... *G06F 11/1068* (2013.01); *G06F 11/1012* (2013.01); *G11C 29/52* (2013.01); *H03M 13/45* (2013.01); *G11C 29/50* (2013.01); *H03M 13/116* (2013.01); *H03M 13/1111* (2013.01)

(58) Field of Classification Search
CPC .. G06F 11/1068; G06F 11/1012; G11C 29/52; G11C 29/50; H03M 13/45; H03M 13/1111; H03M 13/116
USPC ................... 714/764, 765, 768, 773, 799, 42
See application file for complete search history.

(56) References Cited

U.S. PATENT DOCUMENTS

| | | | | |
|---|---|---|---|---|
| 5,553,262 A | * | 9/1996 | Ishida | .................. G06F 12/0846 |
| | | | | 711/123 |
| 6,145,055 A | * | 11/2000 | Fujimoto | ............... G06F 12/126 |
| | | | | 711/128 |
| 6,879,266 B1 | * | 4/2005 | Dye | ......................... G06F 12/08 |
| | | | | 341/51 |

(Continued)

OTHER PUBLICATIONS

Chen et al., Reliability Analysis and Improvement for Multi-Level Non-Volatile Memories with Soft Information, 2011, IEEE, pp. 753-758. (Year: 2011).*

(Continued)

*Primary Examiner* — John J Tabone, Jr.
(74) *Attorney, Agent, or Firm* — Winston Hsu

(57) ABSTRACT

The present invention provides a decoding method of a flash memory controller, wherein the decoding method includes the steps of: reading first data from a flash memory module; decoding the first data, and recording at least one specific address of the flash memory module according to decoding results of the first data, wherein said at least one specific address corresponds to a bit having high reliability errors (HRE) of the first data; reading second data from the flash memory module; and decoding the second data according to said at least one specific address.

20 Claims, 6 Drawing Sheets

(56) References Cited

U.S. PATENT DOCUMENTS

| | | | | |
|---|---|---|---|---|
| 9,933,963 B1* | 4/2018 | Alhussien | G06F 3/0619 |
| 2005/0246499 A1* | 11/2005 | Saida | G06F 12/0864 |
| | | | | 711/128 |
| 2006/0081971 A1* | 4/2006 | Shau | G01R 31/2856 |
| | | | | 257/690 |
| 2009/0319994 A1* | 12/2009 | Oda | G06F 11/3648 |
| | | | | 717/124 |
| 2014/0149827 A1* | 5/2014 | Kim | G06F 11/1064 |
| | | | | 714/766 |
| 2016/0098316 A1 | 4/2016 | Lin | |
| 2016/0179616 A1* | 6/2016 | Ha | H03M 13/2963 |
| | | | | 714/755 |
| 2017/0300377 A1* | 10/2017 | Kaynak | H03M 13/3738 |
| 2018/0198470 A1* | 7/2018 | Lee | G06F 11/1068 |

OTHER PUBLICATIONS

Spinner et al., A Decoder with Soft Decoding Capability for High-rate Generalized Concatenated Codes with Applications in Non-volatile Flash Memories, 2017, IEEE, pp. 185-190. (Year: 2017).*

* cited by examiner

| Block number | Page number | Chunk number | Address | Occurrence count |
|---|---|---|---|---|
| 17 | 22 | 0 | 0x056 | 3 |
| 17 | 22 | 0 | 0x075 | 2 |
| 17 | 22 | 0 | 0x1A2 | 3 |
| 17 | 22 | 0 | 0x2D3 | 1 |
| .... | .... | .... | .... | .... |

DECODING METHOD, ASSOCIATED FLASH MEMORY CONTROLLER AND ELECTRONIC DEVICE

CROSS REFERENCE TO RELATED APPLICATIONS

This application claims the benefit of U.S. provisional application No. 62/542,318 filed on Aug. 8, 2017 and incorporated herein by reference.

BACKGROUND OF THE INVENTION

1. Field of the Invention

The present invention relates to a decoding method, and more particularly, to a decoding method applicable to a flash memory controller.

2. Description of the Prior Art

In order to further improve the capacity of storage devices, a three-dimensional (3D) NAND-type flash memory module has been proposed which can improve storage density via a multi-layer stacking process. Since bit lines in the 3D NAND-type flash memory module are vertical lines with a large width-height ratio, the etching process thereof cannot make each sector in a bit line have the same width. For example, the upper end of a bit line is generally thicker, while the upper end of a word line is thinner, raising the possibility of a short-circuit occurring between the bit lines and word lines, or other potential short-circuit/open-circuit issues. More particularly, the above-mentioned short-circuit issue could result in high reliability errors (HRE) in some specific addresses of the 3D NAND-type flash memory. When reading information of the specific addresses and soft decoding the information, some error bits might have higher reliability, which greatly affects the decoding process, even potentially causing the decoding process to fail.

SUMMARY OF THE INVENTION

Hence, an objective of the present invention is to provide a decoding method, which is capable of solving the increased decoding burdens of the flash memory module due to said high reliability errors.

An embodiment of the present invention discloses a decoding method applicable to a flash memory controller. The decoding method comprises: reading first data from a flash memory module; decoding the first data, and marking at least one specific address of the flash memory module according to a decoding result of the first data, wherein the specific address corresponds to data with high reliability errors (HRE) within the first data; reading second data from the flash memory module; and decoding the second data according to said specific address.

Another embodiment of the present invention discloses a flash memory controller arranged to access a flash memory module. The flash memory controller comprises a read-only memory (ROM), a microprocessor and decoder. The ROM is arranged to store a program code, and the microprocessor is arranged to execute the program code in order to control accessing of the flash memory module. The decoder decodes the first data after reading first data from the flash memory module, and marks at least one specific address in the flash memory module according to a decoding result of the first data, wherein the specific address corresponds to data with high reliability errors (HRE) within the first data; and the decoder reads second data from the flash memory module, and refers to the specific address to decode the second data.

Yet another embodiment of the present invention discloses an electronic device which comprises: a flash memory module and a flash memory controller arranged to access the flash memory module. The flash memory controller decodes first data after reading the first data from the flash memory module, and marks at least one specific address in the flash memory module according to a decoding result of the first data, wherein the specific address corresponds to data with high reliability errors (HRE) within the first data; and the flash memory controller reads second data from the flash memory module and refers to the specific address to decode the second data.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram illustrating a table according to an embodiment of the present invention.

DETAILED DESCRIPTION

Figure 1:
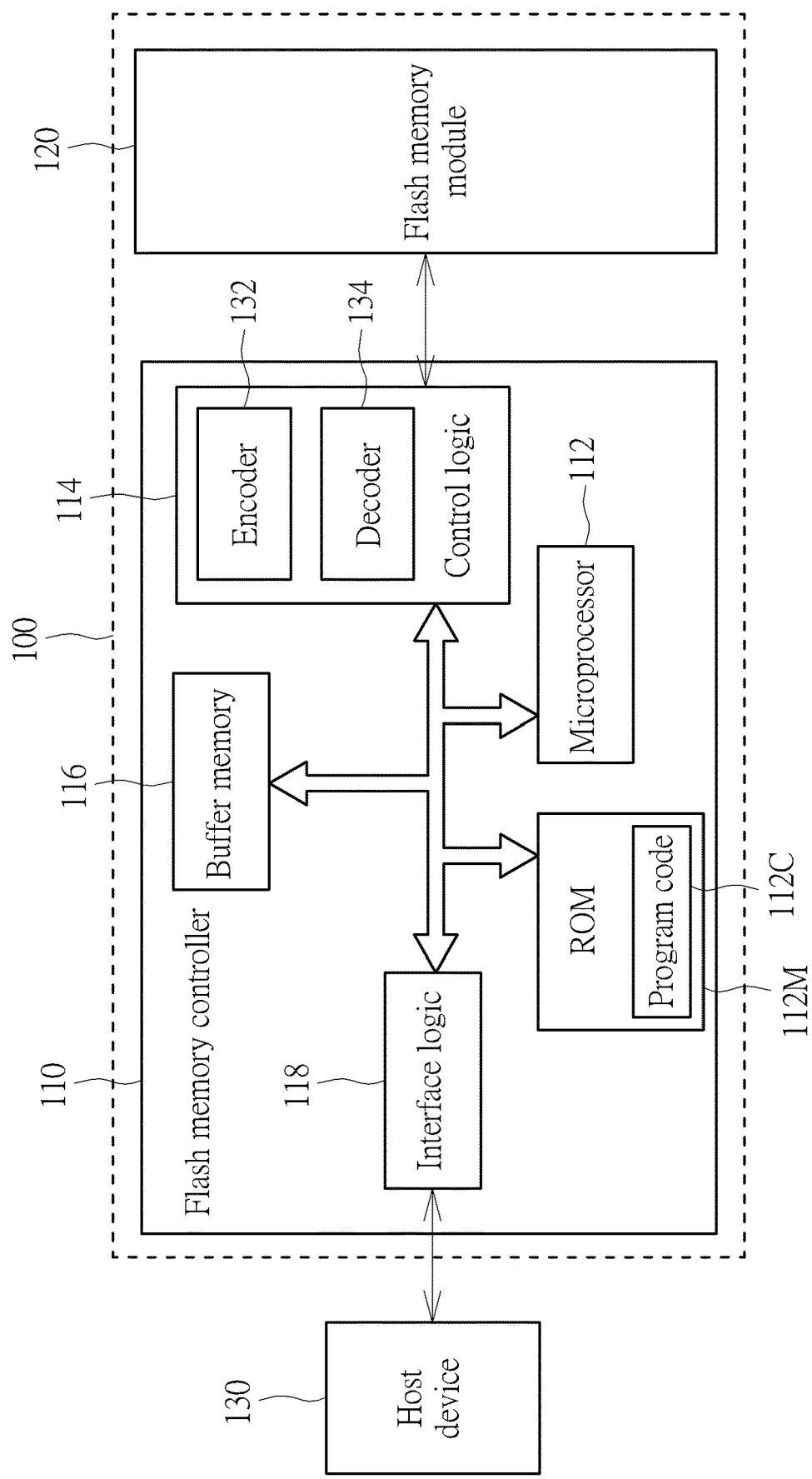
FIG. 1 is a diagram illustrating a memory device according to an embodiment of the present invention.

Refer to FIG. 1, which is a diagram illustrating a memory device 100 according to an embodiment of the present invention. The memory device 100 comprises a flash memory module 120 and a flash memory controller 110, wherein the flash memory controller 110 is arranged to access the flash memory module 120. According to this embodiment, the flash memory controller 110 comprises a microprocessor 112, a read only memory (ROM) 112M, a control logic 114, a buffer memory 116, and an interface logic 118. The ROM 112M is arranged to store a program code 112C, and the microprocessor 112 is arranged to execute the program code 112C in order to control the access of the flash memory module 120. The control logic 114 comprises an encoder 132 and a decoder 134. In this embodiment, the encoder 132 and the decoder 134 are arranged to perform the encoding/decoding operation of a Quasi-Cyclic Low Density Party-Check (QC-LDPC) code.

Typically, the flash memory module 120 comprises multiple flash memory chips, each comprising multiple blocks, and the controller (e.g. the flash memory controller 110 executing the program code 112C via the microprocessor) takes a "block" as the unit of performing operations (e.g. erasing) on the flash memory module 120. Further, a block may recode a specific number of pages, wherein the controller (e.g. the flash memory controller 110 executing the program code 112C via the microprocessor) takes a "page"

as the unit of writing data to the flash memory module 120. In this embodiment, flash memory module 120 may be a 3D NAND-type flash memory.

In practice, the flash memory controller 110 which executes program code 112C via the microprocessor 112 may utilize the inner elements thereof to perform various control operations, e.g. utilizing the control logic 114 to control the access operations of the flash memory module 120 (especially the access operation towards at least one block or at least one page), utilizing the buffer memory 116 to perform the required buffering process, and utilizing the interface logic 118 to communicate with a host device 130. The buffer memory 116 may be a static random access memory (Static RAM (SRAM)), but the present invention is not limited thereto.

In an embodiment, the memory device 100 may be a portable memory device (e.g. a memory card conforming to the SD/MMC, CF, MS, XD specifications), and the host device 130 may be an electronic device connectable to a memory device, such as a smartphone, laptop computer, desktop computer, etc. In another embodiment, the memory device 100 may be a solid state drive (SSD) conforming to the Universal Flash Storage (UFS) or an embedded storage device conforming to the Embedded Multi Media Card (EMMC) specification, in order to be installed in an electronic device such as a smartphone, laptop computer, desktop computer, while the host device 130 may be a processor of the electronic device.

Figure 2:
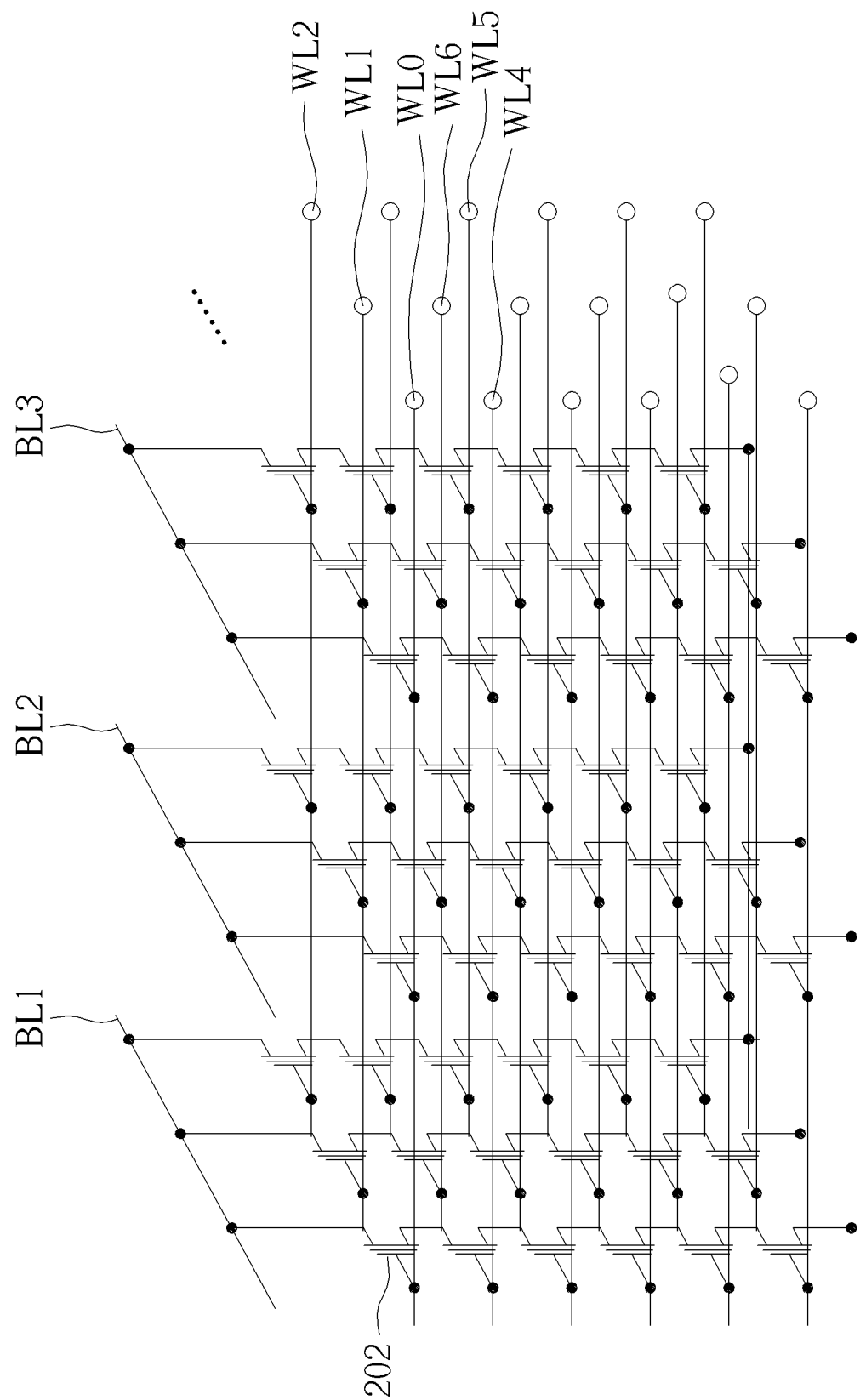
FIG. 2 is a diagram illustrating a 3D NAND-type flash memory.

In this embodiment, the flash memory module 120 is a 3D NAND-type flash memory module. Refer to FIG. 2 which illustrates an exemplary 3D NAND-type flash memory comprising multiple floating-gate transistors 202, which construct the 3D NAND-type flash memory structure via multiple bits lines (e.g. the bit lines BL1-BL3) and multiple word lines (e.g. the word lines WL0-WL2 and WL4-WL6). In FIG. 2, taking the uppermost plane as an example, all floating-gate transistors on the word line WL0 construct at least one page, all floating-gate transistors on the word line WL1 construct at least another page, and all floating-gate transistors on the word line WL2 construct at least another page, and so on. In addition, with different methods of writing to flash memories, the definition between the word line WL0 and pages (such as logic pages) will also be different. More specifically, when perform writing in the Single-Level Cell (SLC) manner, all floating-gate transistors on the word line WL0 correspond to a single logic page only; and when performing writing in the Multi-Level Cell (MLC) manner, all floating-gate transistors on the word line WL0 correspond to two, three or even four logic pages, wherein the situation where all floating-gate transistors on the word line WL0 correspond to three logic pages can be called a Triple-Level Cell (TLC) structure, and the situation where all floating-gate transistors on the word line WL0 correspond to four logic pages can be called a Quad-Level Cell (QLC) structure. Since one skilled in the art should be readily able to understand the relationship between the 3D NAND-type flash memory structure and word lines/pages, detailed illustrations are omitted here for brevity. Further, in the operations of the flash memory controller 110, "page" is the smallest writing unit, and "block" is the smallest erasing unit.

In an embodiment, the gates and floating-gates of each floating-gate transistor surround the sources and drains, also known as the gate-all-around technique, in order to enhance the channel sensing ability.

It should be noted that the example shown in FIG. 2 is merely for illustrating the 3D NAND-type flash memory and the floating-gate transistor 202, and is not a limitation of the present invention. One skilled in the art should readily understand that some other types of 3D NAND-type flash memories can also be applied to the present invention, e.g. a portion of the word lines can be configured to connect to each other.

As mentioned in the related arts, in the 3D NAND-type flash memory module, the bit lines BL1-BL3 have higher width-to-height ratio, meaning it is unlikely that each sector of the bit line will have the same width during its etching process. Hence, a short-circuit situation between the bit lines BL1-BL3 and the word lines WL0-WL2 and WL4-WL6 may easily happen, as well as other short-circuit/open-circuit problems. The above-mentioned short-circuit issue may cause the HRE issue to occur on some bits stored in the floating-gate transistor 202. In other words, when reading information on the floating-gate transistor 202 and soft decoding the information, some error bits with higher reliability may occur, which may severely influence the decoding operation or even make the entire decoding fail. More particularly, the above-mentioned short-circuit issue can become even worse as the program/erase (P/E) cycles increase, because with the increase in time of writing/erasing, there will be more floating-gates transistor 202 having high reliability errors, thereby increasing the difficulty of decoding. Hence, the decoder 134 in this embodiment is provided to record the physical addresses of the floating-gate transistors 202 that have high reliability errors, in order to raise the possibility of successfully decoding.

Figure 3:
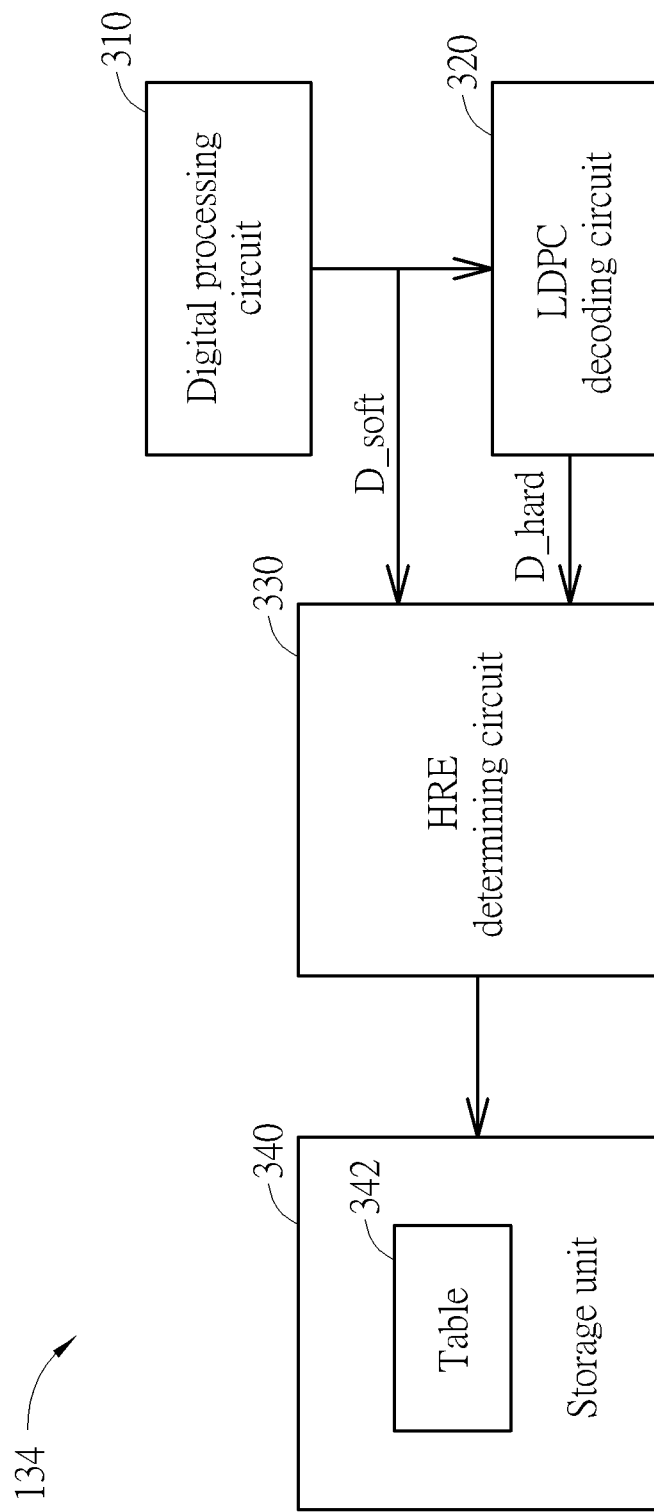
FIG. 3 is a diagram illustrating a decoder according to an embodiment of the present invention.

FIG. 3 is a diagram illustrating the decoder 134 according to an embodiment of the present invention. As shown in FIG. 3, the decoder 134 comprises a digital processing circuit 310, a low-density parity-check code (LDPC) decoding circuit 320, an HRE determining circuit 330 and a storage unit 340, wherein the storage unit 340 comprises a Table 342. In the beginning of the operations of the decoder 134, the decoder 134 reads first data from the flash memory module 120, wherein the first data may be a sector (or a chunk) of a page with a block of the flash memory module 120. In this embodiment, the first data is obtained via using at least two different sensing voltages to access the floating-gate transistors 202 in the flash memory module 120, wherein the first data comprises the soft information D_soft of multiple bits, and the soft information D_soft of each bit comprises an initial bit value (or sign bit) and at least two soft bits, wherein the initial bit value within the information of each bit is either "0" or "1", and said at least two soft bits within the information of each bit are arranged to represent or calculate the reliability of the initial bit value. Some possible combinations of different bit values and their respective results are described as follows: when the initial bit value is "1" and the two soft bits are (1, 1), this shows "the initial bit value 1" has extremely high reliability (or can be considered to occur with high possibility); when the initial bit value is "1" and the two soft bits are (1, 0), this shows the "initial bit value 1" has relatively high reliability; when the initial bit value is "1" and the two soft bits are (0, 1), this shows "the initial bit value 1" has relatively low reliability; and when the initial bit value is "1" and the two soft bits are (0, 0), this shows "the initial bit value 1" has extremely low reliability. Some other possible combinations of different bit values and the respective results thereof are described as follows: when the initial bit value is "0" and the two soft bits are (1, 1), this shows "the initial bit value 1" has extremely low reliability; when the initial bit value is "0" and the two soft bits are either (1, 0) or (0, 1), this shows "the initial bit value 0" has medium reliability; and when the initial bit value is "0" and the two soft bits are (0, 0), this shows "the initial bit value 0" has the highest reliability.

It should be noted that the above-mentioned method which uses two soft bits to determine the reliability is only for illustrative purposes, and is not a limitation of the present invention. In some embodiments of the present invention, other than using two soft bits to represent reliability, the flash memory module 120 can adopt another method: for example, referring to a mapping table or other calculation methods. In addition, the determination of the reliability may be performed according to the bit values of both the initial bit value and the soft bits.

Next, the LDPC decoding circuit 320 may decode the soft information D_soft, in order to generate multiple final bit values D_hard of the first data.

The present invention does not particularly focus on the detailed operations regarding the soft information D_soft or the LDPC decoding circuit 320; related details can be known by referring to R.O.C. application No. 100102086 and other related documents. Hence, details of the digital processing circuit 310 and the LDPC decoding circuit 320 are omitted here for brevity.

Next, the HRE determining circuit 330 compares the soft information D_soft of the first data with the final bit value D_hard in a bit-by-bit manner, in order to determine which bits within the first data have high reliability and incorrect bit values. Then, the physical addresses corresponding to those bits are recorded into Table 342.

Figure 4:
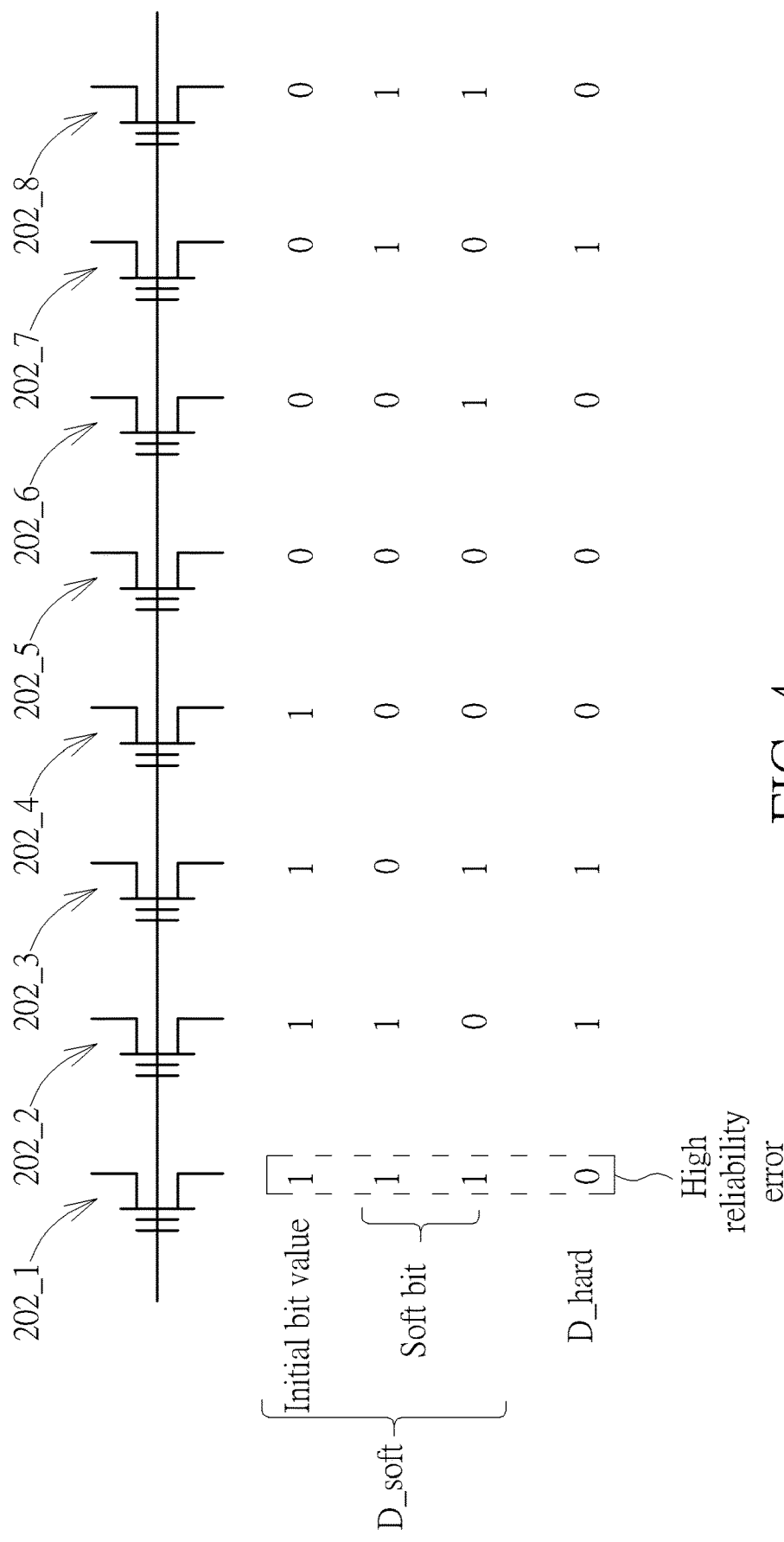
FIG. 4 is a diagram illustrating reading data from eight floating-gate transistors.

Refer to FIG. 4, which is a diagram illustrating the decoder 134 sequentially processing the data read from the eight floating-gate transistors 202_1-202_8. In FIG. 4, initially, the decoder 134 reads the floating-gate transistor 202_1, and it is assumed that the initial bit value of the generated soft information D_soft is "1", the generated two soft bits are (1, 1), and the final bit value D_hard outputted by the LDPC decoding circuit 320 is "0". Since the initial bit value is different from the final bit value (which means the initial bit value is incorrect) and the two soft bits (1, 1) represent high reliability, the floating-gate transistor 202_1 will be determined as corresponding to bits with high reliability errors (i.e. after being read, the information recorded by the floating-gate transistor 202_1 is determined as error bits with high reliability), and the physical address of the floating-gate transistor 202_1 will be recorded in Table 342. Next, the decoder 134 reads the floating-gate transistor 202_2, and it is assumed that the initial bit value of the generated soft information D_soft is "1", the two soft bits are (1, 0), and the final bit value D_hard outputted by the LDPC decoding circuit 320 is "1". Since the initial bit value is the same as the final bit value (which means the initial bit value is correct), the floating-gate transistor 202_2 will be determined as not corresponding to bits with high reliability errors, and the physical address of the floating-gate transistor 202_2 will not be recorded in Table 342. Next, the decoder 134 reads the floating-gate transistor 202_3, and it is assumed that the initial bit value of the generated soft information D_soft is "1", the generated two soft bits are (0, 1), and the final bit value D_hard outputted by the LDPC decoding circuit 320 is "1", Since the initial bit value is the same as the final bit value (which means the initial bit value is correct), the floating-gate transistor 202_3 will be determined as not corresponding to bits with high reliability errors, and the physical address of the floating-gate transistor 202_3 will not be recorded in Table 342. Next, the decoder 134 reads the floating-gate transistor 202_4, and it is assumed that the initial bit value of the generated soft information D_soft is "1", the generated two soft bits are (0, 0), and the final bit value D_hard outputted by the LDPC decoding circuit 320 is "1". Although the initial bit value is different from the final bit value (which means the initial bit value is incorrect), the two soft bits (0, 0) still indicate low reliability. Hence, the floating-gate transistor 202_4 will be determined as not corresponding to bits with high reliability errors, and the physical address of the floating-gate transistor 202_4 will not be recorded in Table 342. Next, the decoder 134 reads the floating-gate transistor 202_5, and it is assumed that the initial bit value of the generated soft information D_soft is "0", the two soft bits are (0, 0), and the final bit value D_hard outputted by the LDPC decoding circuit 320 is "0". Since the initial bit value is the same as the final bit value (which means the initial bit value is correct), the floating-gate transistor 202_5 will be determined as not corresponding to bits with high reliability errors, and the physical address of the floating-gate transistor 202_5 will not be recorded in Table 342. Next, the decoder 134 reads the floating-gate transistor 202_6, and it is assumed that the initial bit value of the generated soft information D_soft is "0", the two soft bits are (0, 1), and the final bit value D_hard outputted by the LDPC decoding circuit 320 is "0". Since the initial bit value is the same as the final bit value (which means the initial bit value is correct), the floating-gate transistor 202_6 will be determined as not corresponding to bits with high reliability errors, and the physical address of the floating-gate transistor 202_6 will not be recorded in Table 342. Next, the decoder 134 reads the floating-gate transistor 202_7, and it is assumed that, the initial bit value of the generated soft information D_soft is "0", the two soft bits are (1, 0), and the final bit value D_hard outputted by the LDPC decoding circuit 320 is "1". Although the initial bit value is different from the final bit value (which means the initial bit value is incorrect), the two soft bits (1, 0) still represent medium reliability rather than high reliability. Hence, the floating-gate transistor 202_7 will be determined as not corresponding to bits with high reliability errors, and the physical address of the floating-gate transistor 202_7 will not be recorded in Table 342. Finally, the decoder 134 reads the floating-gate transistor 202_8, and it is assumed that the initial bit value of the generated soft information D_soft is "0", and the two soft bits are (1, 1), and the final bit value D_hard outputted by the LDPC decoding circuit 320 is "0". Since the initial bit value is the same as the final bit value (which means the initial bit value is correct), the floating-gate transistor 202_8 will be determined as not corresponding to bits with high reliability errors, and the physical address of the floating-gate transistor 202_8 will not be recorded in Table 342.

FIG. 5 is a diagram illustrating Table 342 according to an embodiment of the present invention. As shown in FIG. 5, Table 342 records the block number, page number, block set number and address information of the floating-gate transistor 202 in which high reliability errors have ever occurred. In addition, Table 342 will also record the HRE count of the floating-gate transistor 202 during decoding.

In an embodiment, the decoder 134 shown in FIG. 3 may further comprise a register arranged to temporarily store addresses of the floating-gate transistors 202 that have bits with high reliability errors generated by the HRE determining circuit 330, and may write the addresses into Table 342 when the number of the temporarily stored addresses reach a threshold value (e.g. ten addresses).

Further, since the space of the storage unit 342 is limited, a Least-recently-used (LRU) algorithm can be used when data is written into Table 342, wherein the LRU algorithm removes the addresses of the floating-gate transistors 202 that have not encountered high reliability errors.

Figure 6:
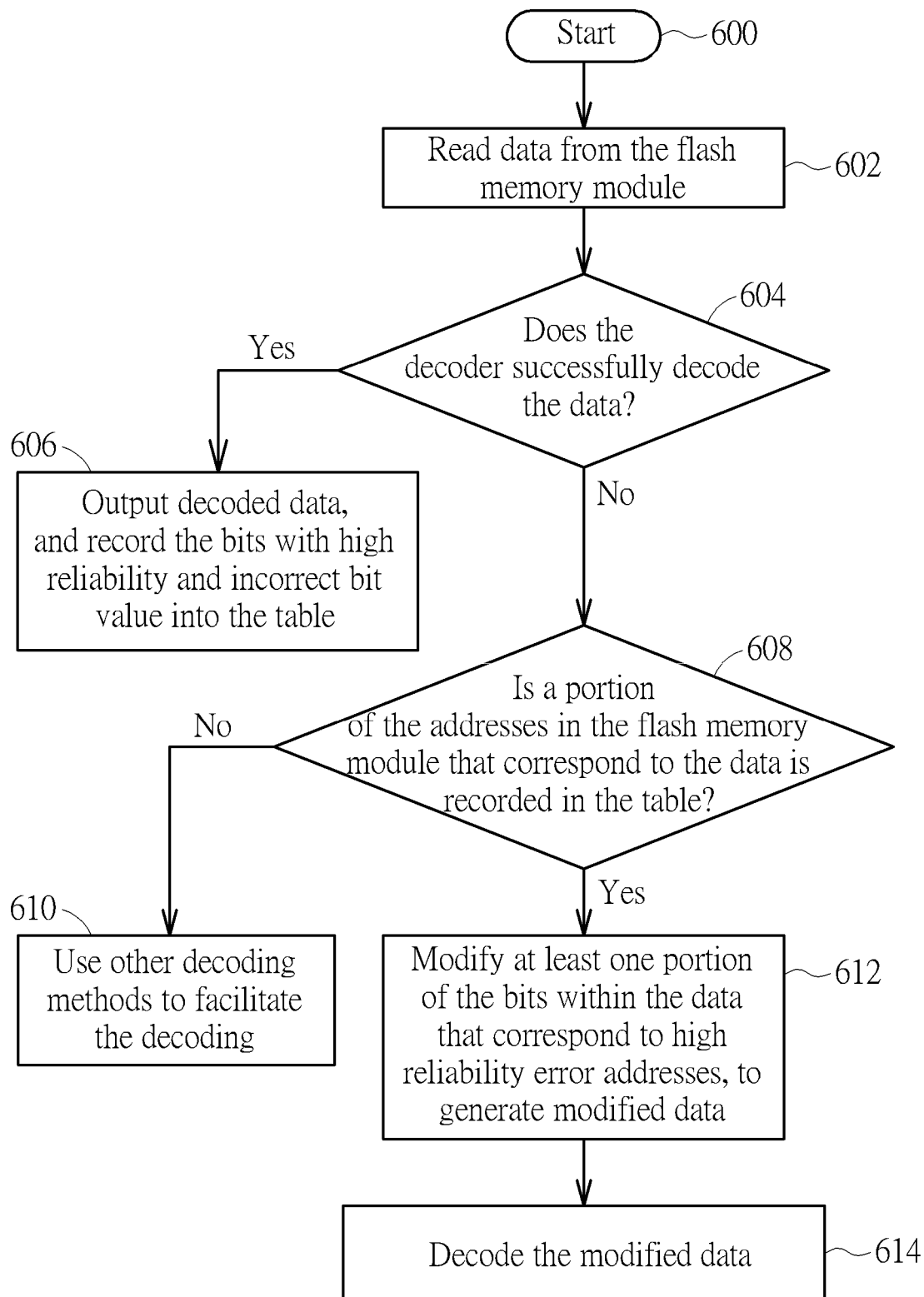
FIG. 6 is a flowchart illustrating a decoding method according to an embodiment of the present invention.

FIG. 6 is a flowchart illustrating a decoding method according to an embodiment of the present invention. The detailed steps are as follows.

Step 600: Start.

Step 602: The flash memory controller 110 reads data from the flash memory module 120.

Step 604: The decoder 134 decodes the data, wherein when the decoding succeeds (meaning the LDPC decoding circuit 320 is able to generate a final bit value), the flow goes to Step 606; otherwise (the decoding fails) the flow goes to Step 608.

Step 606: The decoder 134 outputs the decoded data, and the high-reliability-error determining circuit determines which bits within the data have high reliability and an incorrect bit value, and then records those bits into Table 342.

Step 608: Determine whether a portion of the addresses in the flash memory module 120 that correspond to the data is recorded in Table 342; if so, the flow goes to Step 612; otherwise, the flow goes to Step 610.

Step 610: Use other decoding methods or disk-saving methods (e.g. an error correction method such as the RedundantArray of Independent Disks (RAID)), in order to facilitate the decoding.

Step 612: Modify at least one portion of the bits within the data that correspond to high reliability errors addresses, to generate modified data.

Step 614: Decode the modified data.

In Step 612, the decoder 134 may modify a bit in advance, and then decode it, wherein the bit corresponds to floating-gate transistors that have most high reliability errors. Other bits can then be modified if the decoding fails later on. For example, it is assumed that the floating-gate transistors 202 corresponding to the $1^{st}$, $5^{th}$, $6^{th}$ and $8^{th}$ bits within the data are written in Table 342, and the floating-gate transistor 202 corresponding to the $5^{th}$ bit has most high reliability errors. In this situation, when the decoding of the data fails, the decoder 134 may flip the initial bit value of the $5^{th}$ bit (e.g. change it from "0" to "1" or vice versa) to generate modified data for the use of decoding. If the decoding still fails, the decoder 134 further flips the respective initial bit values of the $1^{st}$, $6^{th}$ and $8^{th}$ bits in order to generate modified data for the use of follow-up decoding.

It should be noted that the previous paragraph is mainly for illustrative purposes, and should not be considered a limitation of the present invention. In some other embodiments, the decoder 134 may flip the respective initial bit values of the $1^{st}$, $5^{th}$, $6^{th}$ and $8^{th}$ bits in the beginning to generate modified data for follow-up decoding. As long as the bit flipping action is made based on the addresses where high reliability errors occur and recorded in a table (e.g. Table 342), any modification to the design of the present invention should fall with the scope of the present invention.

In an embodiment, the information recorded in Table 342 may also be arranged to determine whether there are too many floating-gate transistors 202 in the block that constantly has high reliability errors, and accordingly determine whether the block should be erased or banned from being used. Specifically, when the content of Table 342 indicates that the number of addresses corresponding to high reliability errors within a specific block is higher than a threshold value, in order to prevent those addresses corresponding to high reliability errors from continuously increasing to the extent where the data cannot be decoded successfully, the microprocessor 112 may move valid data within the data from the specific block to other blocks (such as a garbage collection operation), then mark the specific block as invalid, and set the flash memory controller 110 to not write data into the specific block later on.

To summarize, the decoding method provided by the present invention continuously records physical addresses corresponding to the bits with high reliability errors into a table during the decoding process, and the content of the table may be referred to when the follow-up decoding fails. Considering the high possibility of the constant occurrence of high reliability errors on the floating-gate transistors which seriously interferes with decoding, the present invention is able to mitigate the influence of the high reliability errors occurring on floating-gate transistors, thereby increasing the possibility of successful decoding.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding method applicable to a flash memory controller, comprising:
   reading first data from a flash memory module;
   decoding the first data, and marking at least one specific address of the flash memory module according to a decoding result of the first data, wherein the at least one specific address corresponds to data with high reliability errors (HRE) within the first data;
   reading second data from the flash memory module; and
   decoding the second data according to said specific address.

2. The decoding method of claim 1, wherein the step of decoding the first data and marking at least one specific address of the flash memory module according to the decoding result of the first data comprises:
   recording said specific address of the flash memory module in a table according to the decoding result of the first data.

3. The decoding method of claim 1, wherein decoding of the first data is a soft decoding operation, and during decoding of the first data, an initial bit value and a reliability value are calculated for each bit of the first data, and the data with HRE within the first data represents that the data has high reliability and an incorrect initial bit value.

4. The decoding method of claim 1, wherein the step of marking said specific address of the flash memory module according to the decoding result of the first data comprises performing the following steps for each bit of the first data:
   reading the flash memory module in order to obtain at least two soft bits and an initial bit value that correspond to the bit;
   performing soft decoding on the bit value and said at least two soft bits, in order to obtain a final bit value and a reliability value of the bit;
   determining whether the final bit value and the initial bit value are identical; and
   when the final bit value is different from the initial bit value, and the bit has high reliability, determining the bit as having HRE, and recording the address of the bit in the flash memory module into the table as the specific address.

5. The decoding method of claim 4, further comprising:
   recording an occurrence count of the specific address corresponding to a bit with HRE during decoding of the first data.

6. The decoding method of claim 1, wherein the second data corresponds to said specific address and the decoding method further comprises:
- decoding the second data;
- when decoding of the second data fails, modifying at least one bit in the second data that corresponds to at least one specific address, in order to generate modified second data; and
- decoding the modified second data.

7. The decoding method of claim 6, wherein the second data corresponds to multiple specific addresses, and the decoding method further comprises:
- respectively recording occurrence counts of the multiple specific addresses corresponding to bits with HRE during decoding of the first data;
- wherein said bit corresponds to one of the specific addresses that has the largest occurrence count.

8. The decoding method of claim 1, further comprising:
- determining whether the number of at least one marked specific address located in a block of the flash memory module is larger than a threshold value; and
- when said number is larger than the threshold value, marking the block as invalid.

9. A flash memory controller, wherein the flash memory controller is arranged to access a flash memory module, and the flash memory controller comprises:
- a read-only memory (ROM), arranged to store a program code;
- a microprocessor, arranged to execute the program code in order to control accessing of the flash memory module; and
- a decoder;
- wherein the decoder decodes first data after reading the first data from the flash memory module, and marks at least one specific address in the flash memory module according to a decoding result of the first data, wherein the specific address corresponds to data with high reliability errors (HRE) within the first data; and the decoder reads second data from the flash memory module, and refers to the specific address to decode the second data.

10. The flash memory controller of claim 9, wherein the microprocessor records at least one specific address of the flash memory module into a table.

11. The flash memory controller of claim 9, wherein the decoder decoding the first data is a soft decoding operation, and during decoding of the first data, an initial bit value and a reliability value are calculated for each bit of the first data, and the data with HRE within the first data represents that the data has high reliability and an incorrect initial bit value.

12. The flash memory controller of claim 9, wherein the decoder performs the following steps for each bit of the first data:
- reading the flash memory module in order to obtain at least two soft bits and an initial bit value that correspond to the bit;
- performing soft decoding on the initial bit value and said at least two soft bits, in order to obtain a final bit value and a reliability value of the bit;
- determining whether the final bit value and the initial bit value are identical; and
- when the final bit value is different from the initial bit value and the reliability value of the bit is high, determining the bit as having HRE, and recording the address of the bit in the flash memory module into the table as the specific address.

13. The flash memory controller of claim 12, wherein the microprocessor further records an occurrence count of the specific address corresponding to a bit with HRE during decoding of the first data.

14. The flash memory controller of claim 9, wherein the decoder decodes the second data, and when decoding of the second data fails, modifying at least one bit within the second data that corresponds to at least one specific address, in order to generate modified second data and decode the modified second data.

15. The flash memory controller of claim 14, wherein the second data corresponds to multiple specific addresses, the microprocessor further records an occurrence count of the multiple specific addresses corresponding to a bit with HRE during decoding of the first data, and said bit corresponds to one of the specific addresses that has a largest occurrence count.

16. The flash memory controller of claim 9, wherein the microprocessor determines whether the quantity of the marked at least one specific address located in a block of the flash memory module is larger than a threshold value, and when the quantity is larger than the threshold value, the microprocessor marks the block as invalid.

17. An electronic device, comprising:
- a flash memory module; and
- a flash memory controller, arranged to access the flash memory module;
- wherein the flash memory controller decodes first data after reading the first data from the flash memory module, and marks at least one specific address in the flash memory module according to a decoding result of the first data, wherein the specific address corresponds to data with high reliability errors (HRE) within the first data; and the flash memory controller reads second data from the flash memory module and refers to the specific address to decode the second data.

18. The electronic device of claim 17, wherein the decoder decoding the first data is a soft decoding operation; an initial bit value and a reliability value are calculated for each bit of the first data during decoding the first data; and the data with HRE within the first data represents bits having high reliability and an incorrect initial bit value.

19. The electronic device of claim 17, wherein the flash memory controller performs the following operations for each bit of the first data:
- reading the flash memory module in order to obtain at least two soft bits and an initial bit value that correspond to the bit;
- soft decoding the bit value and said at least two soft bits, in order to obtain a final bit value and a reliability value of the bit, and determining whether the final bit value and the initial bit value are identical; and
- when the final bit value is different from the initial bit value and the bit has high reliability, determining the bit as having HRE, and recording the address of the bit in the flash memory module into the table as the specific address.

20. The electronic device of claim 17, wherein the flash memory controller determines whether the quantity of the marked at least one specific address located in a block of the flash memory module is larger than a threshold value, and when the quantity is larger than the threshold value, the flash memory controller marks the block to be invalid.

* * * * *